(12) United States Patent
Lien et al.

(10) Patent No.: US 7,187,571 B1
(45) Date of Patent: Mar. 6, 2007

(54) METHOD AND APPARATUS FOR CAM WITH REDUCED CROSS-COUPLING INTERFERENCE

(75) Inventors: Chuen-Der Lien, Los Altos Hills, CA (US); Chau-Chin Wu, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 220 days.

(21) Appl. No.: 10/821,601

(22) Filed: Apr. 9, 2004

(51) Int. Cl.
*G11C 15/00* (2006.01)
*G11C 7/00* (2006.01)

(52) U.S. Cl. ............... 365/49; 365/63; 365/189.07

(58) Field of Classification Search ............. 365/49, 365/63, 189.07, 51
See application file for complete search history.

(56) References Cited

U.S. PATENT DOCUMENTS

| 4,723,224 | A | | 2/1988 | Van Hulett et al. |
| 6,061,262 | A | * | 5/2000 | Schultz et al. ............... 365/49 |
| 6,128,207 | A | | 10/2000 | Lien et al. |
| 6,137,707 | A | | 10/2000 | Srinivasan et al. |
| 6,219,748 | B1 | | 4/2001 | Srinivasan et al. |
| 6,262,907 | B1 | | 7/2001 | Lien et al. |
| 6,687,785 | B1 | * | 2/2004 | Pereira ....................... 711/108 |
| 6,842,360 | B1 | * | 1/2005 | Srinivasan ................... 365/49 |

* cited by examiner

*Primary Examiner*—Son Dinh
(74) *Attorney, Agent, or Firm*—Heimlich Law; Alan Heimlich, Esq.

(57) ABSTRACT

A method and apparatus for a CAM with reduced cross-coupling interference have been disclosed.

57 Claims, 21 Drawing Sheets

US 7,187,571 B1

METHOD AND APPARATUS FOR CAM WITH REDUCED CROSS-COUPLING INTERFERENCE

RELATED APPLICATION

This patent application is related to a co-pending application Ser. No. 10/821,556, filed on Apr. 9, 2004 titled "Method and Apparatus for CAM with Selective Parallel Match Lines" by the same inventors as this application and assigned to the same assignee.

FIELD OF THE INVENTION

The present invention pertains to memory devices. More particularly, the present invention relates to a method and apparatus for a CAM (Content Addressable Memory) with reduced cross-coupling interference.

BACKGROUND OF THE INVENTION

CAMs are used in a variety of applications. They differ from RAM (Random Access Memory) because a RAM is presented an address and reads or writes data, whereas a CAM is capable of, among other things, being presented data and sensing if a matching entry is stored. In order to determine quickly if there is a matching entry, many locations may have to be checked simultaneously. This may consume large amounts of power and may slow the comparison. This presents a problem.

Additionally since many locations may be checked simultaneously, this may lead to cross-coupling interference which may affect the performance of a CAM. This presents a problem.

FIG. 1 illustrates one CAM cell (CC) with a word line (WLm), a match line (MLm), data inputs for reading and writing (Dn and Dn*), and compare data lines (CDn and CDn*).

FIG. 2 shows an array of CAM cells of dimension n columns by m rows. Each row of cells has a common word line, a common match line, and a single sense amplifier at the end of a row of CAM cells. For example, row 0 has word line WL0 which communicates to CAM cells (CC) connected to data line pairs, D0/D0*, D1/D1*,D2/D2*, through Dn/Dn*. The match line ML0 is also in communication with the CAM cells connected to these data line pairs and ML0 communicates with sense amplifier 0 SA0 located substantially at the end of the row of CAM cells (CC). This arrangement is repeated for m word lines WLm, for m match lines MLm, and for m sense amplifiers Sam (i.e. WL0, WL1, WL2, . . . , WLm, the corresponding ML0, ML1, ML2, . . . , MLm, and the corresponding SA0, SA1, SA2, . . . , SAm). Since there is one match line per row and one sense amplifier per row at the end of a row of a CAM array, many CAM cells are connected to a single match line. Capacitance on this line may be large and as a result the sense amplifier may be slow in responding to signal changes. This may present a problem.

FIG. 3 shows an approach 300 trying to overcome some of the problems associated with the approach shown in FIG. 2. Here in FIG. 3, the CAM array is divided into sub-arrays (for example, Sub-Array A and Sub-Array B). In each row and in between two sub-arrays, is one sense amplifier (such as SA0) which receives two match lines one from the left (such as Sub-Array A, ML0A) and the other from right (such as Sub-Array B, ML0B). Because a particular match line in FIG. 3 connects to half as many CAM cells as in FIG. 2 for a given array size, the capacitance on each match line (such as ML0A, and ML0B) is approximately half. This results in better speed. However the two input sense amplifier may be larger in die size and may draw higher power than a single input sense amplifier. This may present a problem.

FIG. 4 illustrates a layout 400 for a TCAM cell. For illustrative purposes only straight metal lines are shown, and not interconnects (such as vias). The dashed line indicates a single TCAM cell. This single TCAM cell may be repeated to produce a group of cells. Additionally for illustrative purposes, example metal layers are denoted. Here on metal layer 2 is Low_Match. Running substantially parallel to Low_Match, from left to right, on metal layer 3 is Value_Bit_Line, Value_Bit_Line*, Data_Line*, Data_Line, Mask_Bit_Line, and Mask_Bit_Line*. Running substantially perpendicular to Low_Match, from top to bottom, is Bypass on metal 5, and High_Match line on metal 4. As will be noted Low_Match on metal 2 runs parallel and physically close to Data_Line on metal 3 and Data_Line* on metal 3. This proximity leads to capacitive and inductive coupling between these lines. Additionally the overlap between the Bypass line on metal 5 and Data_Line* on metal 3 and Data_Line on metal 3 leads to coupling between these lines. Also the overlap between the High_Match line on metal 4 and Data_Line* on metal 3 and Data_Line on metal 3 leads to coupling between these lines. This may present a problem.

FIG. 5 illustrates a layout 500 for a TCAM cell. For illustrative purposes only straight metal lines are shown, and only a single via interconnect High_Match Via Pickup is shown. The dashed line indicates a single TCAM cell. This single TCAM cell may be repeated to produce a group of cells. Additionally for illustrative purposes, example metal layers are denoted. Here on metal layer 2 is Low_Match. Running substantially parallel to Low_Match, from left to right, on metal layer 3 is Value_Bit_Line, Value_Bit_Line*, Data_Line*, Data_Line, Mask_Bit_Line, and Mask_Bit_Line*. Running substantially perpendicular to Low_Match, from top to bottom, is Bypass on metal 5, and High_Match line on metal 4. Via interconnect High_Match Via Pickup is shown as a dark dotted box on High_Match and may, for illustrative purposes, be considered to extend normal to the paper surface downward to connect to a device, such as the source of a transistor (for example, see the source of Q22 in FIG. 14). High_Match Via Pickup traverses the metal layers (including metal 3) as it connects to a device in the TCAM cell and is physically close to Data_Line on metal 3 and Data_Line* on metal 3. This proximity leads to capacitive and inductive coupling between these lines. This may present a problem.

FIG. 6 illustrates a layout 600 for a TCAM cell. For illustrative purposes only straight metal lines are shown, and only a single via interconnect Low_Match Via Pickup is shown. The dashed line indicates a single TCAM cell. This single TCAM cell may be repeated to produce a group of cells. Additionally for illustrative purposes, example metal layers are denoted. Here on metal layer 2 is Low_Match. Running substantially parallel to Low_Match, from left to right, on metal layer 3 is Value_Bit_Line, Value_Bit_Line*, Data_Line*, Data_Line, Mask_Bit_Line, and Mask_Bit_Line*. Running substantially perpendicular to Low_Match, from top to bottom, is Bypass on metal 5, and High_Match line on metal 4. Via interconnect Low_Match Via Pickup is shown as a dark dotted box on Low_Match and may, for illustrative purposes, be considered to extend normal to the paper surface downward to connect to a device, such as the drain of a transistor (for example, see the drain of Q26 in FIG. 14). Low_Match Via Pickup traverses the metal layers (including metal 1) as it connects to a device in the TCAM cell and is physically close to Data_Line on metal 3 and Data_Line* on metal 3. This proximity leads to capacitive and inductive coupling between these lines. This may present a problem.

BRIEF DESCRIPTION OF THE DRAWINGS

The invention is illustrated by way of example and not limitation in the figures of the accompanying drawings in which.

DETAILED DESCRIPTION

The invention, as exemplified in various embodiments, illustrates how a CAM may reduce cross-coupling interference. In one embodiment of the invention, a series of submatch lines are used to reduce capacitance seen by a sense circuit (such as a sense amplifier). In one embodiment of the invention, the connections to cells in a row are implemented using various interconnection approaches. In one embodiment of the invention, signal lines are routed in such a fashion as to help reduce some cross-coupling interference.

Figure 7:
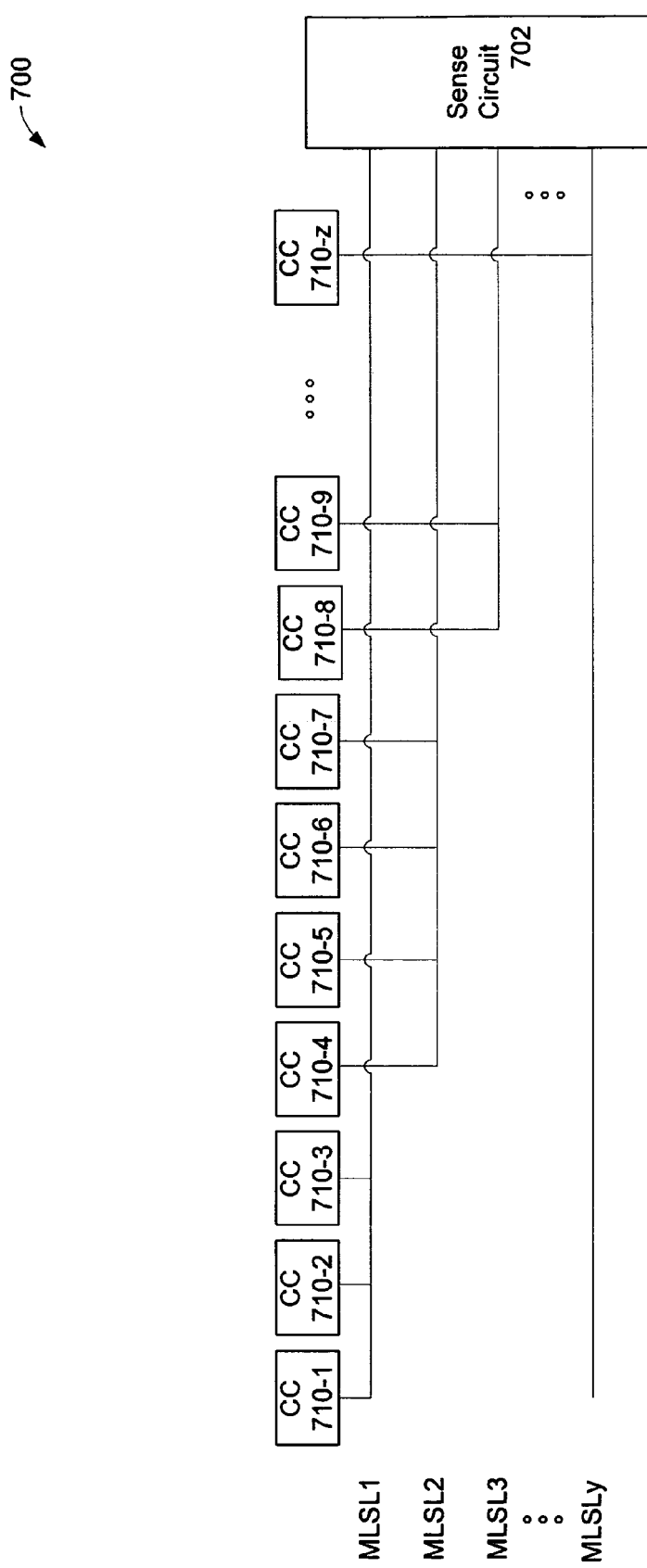
FIG. 7 illustrates one embodiment of the invention showing in block diagram form how a series of submatch lines associated with cells in a row are connected to a sense circuit.

FIG. 7 illustrates one embodiment of the invention 700 showing in block diagram form how a series of submatch lines (MLSL1 through MLSLy) associated with cells in a row (710-1 through 710-z) are connected to a sense circuit (702). For clarity of illustration, only cells and the associated match lines are shown. Note that not all the cells are connected using a single match line. For example three cells 710-1, 710-2, and 710-3 are connected via match line submatch line 1 (MLSL1) to the sense circuit 702. Four cells 710-4, 710-5, 710-6, and 710-7 are connected via MLSL2 to the sense circuit 702. Two cells 710-8, and 710-9 are connected via MLSL3 to the sense circuit 702. One of skill in the art will appreciate that this approach may be extended and so MLSLy is shown connecting cell 710-z to sense circuit 702.

In one embodiment of the invention the diagram in FIG. 7 may be used to illustrate a method for achieving substantially equal capacitance on the input lines to a sense circuit (such as 702). For example, if FIG. 7 denotes a spatial relationship between the cells in a row (710-1 through 710-z) and the sense circuit (702), then there is capacitance associated with, among other things, the distance of a submatch line. There is also capacitance associated with connection to each cell. Since capacitance is related to time delay, then substantially matching the capacitance on the submatch lines may speed operation of sensing the submatch lines. Thus, for example, in FIG. 7, submatch line MLSL1 is longer in length than MLSL2. Thus, MLSL1 may be expected to have a higher capacitance than MLSL2 assuming they are routed substantially the same and use a similar interconnect approach (for example, the same interconnect layers on an integrated circuit (IC)) due to the length of MLSL1 being longer than MLSL2. However, MLSL1 only connects to three cells (701-1, 710-2, and 710-3), whereas MLSL2 connects to four cells (7104, 710-5, 710-6, and 710-7) and thus the capacitance associated with MLSL2 connecting to four cells may be expected to be higher than MLSL1 which is connected to three cells, again assuming they are routed substantially the same and use a similar interconnect approach. Thus, it is possible, that the capacitance seen by a sense circuit 702 on varying submatch lines may be substantially the same.

One of skill in the IC art will appreciate that connections, coupling, and routing of signal lines, such as match lines, submatch lines, etc. may be achieved using various interconnect layers on an IC, for example, on varying metal layers, polysilicon layers, implanted layers, using vias, or any combination of these. Also, each interconnect layer on an IC has different capacitance characteristics. Thus, for example, to reduce routing capacitance, a route (or trace) may be on an upper metal layer, whereas a shorter route may use a lower metal layer and/or polysilicon which may have a higher capacitance and/or resistance that may affect signal delay.

In one embodiment of the invention, submatch lines may use a variety of different layers (interconnect layers) to connect to the cells. Thus, for example, if submatch line MLSL3 uses layers that result in higher routing capacitance than say MLSL1 and MLSL2, then to maintain substantially the same capacitive load as MLSL1 and MLSL2, MLSL3 may only connect to two cells 410-8, and 410-9.

Figure 8:
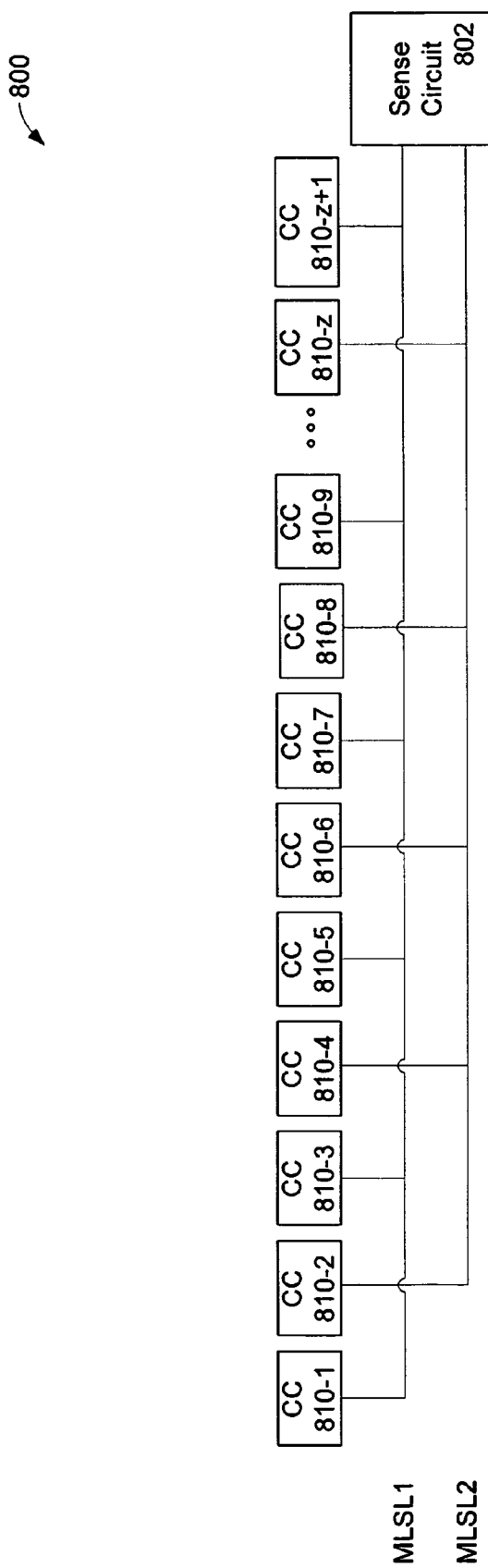
FIG. 8 illustrates one embodiment of the invention where every other cell is connected to a different submatch line.

FIG. 8 illustrates one embodiment of the invention 800 where every other cell in a row is connected to a different submatch line. For example, submatch line MLSL1 connects cells 810-1, 810-3, 810-5, 810-7, 810-9, to 810-z+1 to sense circuit 802, while MLSL2 connects cells 810-2, 8104, 810-6, 810-8, to 810-z to sense circuit 802.

Figure 9:
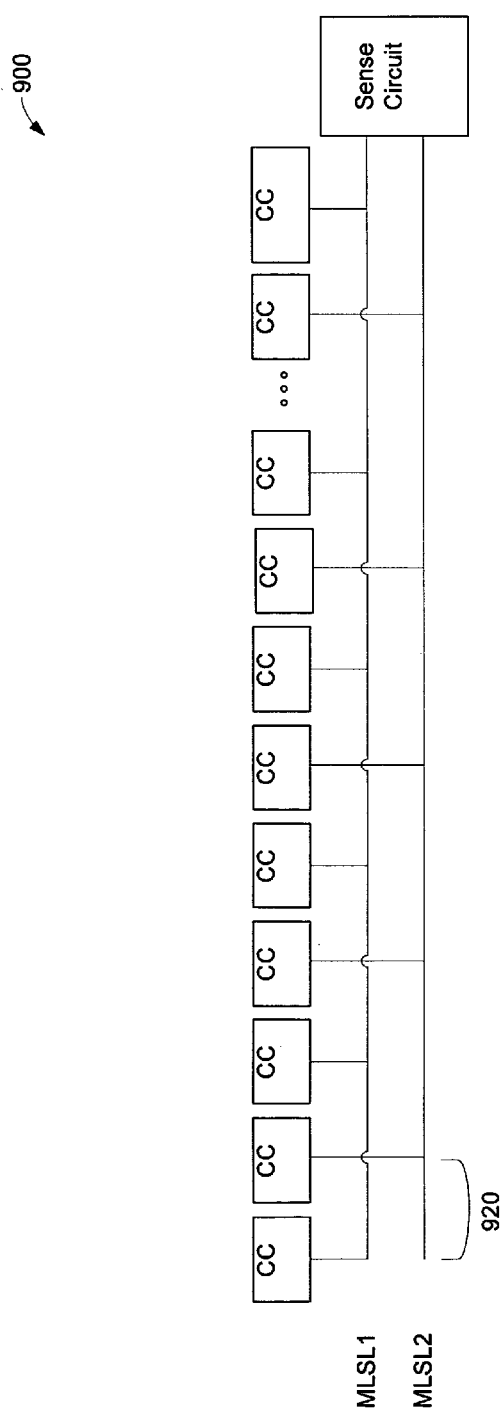
FIG. 9 illustrates one embodiment of the invention where every other cell is connected to a different submatch line and where a submatch line is extended in length.

FIG. 9 illustrates one embodiment of the invention 900 where every other cell in a particular row is connected to a different submatch line and where submatch line MLSL2 is extended in length (segment 920). This stub 920 may be used to increase the capacitance of submatch line MLSL2 to more closely match it to the capacitance of submatch line MLSL1. One of skill in the art will recognize that this approach may be used on any submatch line to create additional capacitance.

Figure 10:
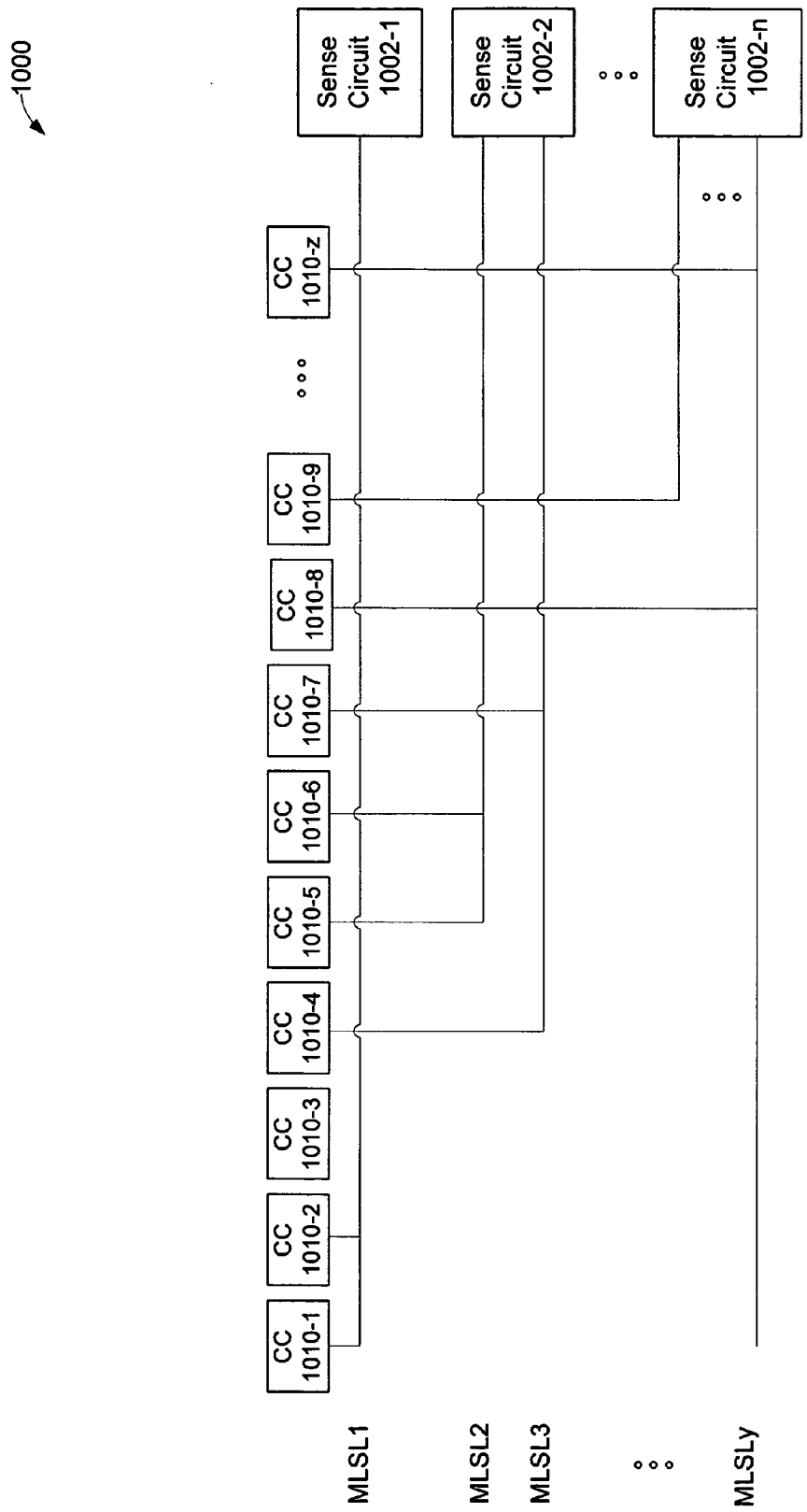
FIG. 10 illustrates one embodiment of the invention where different cells are connected to a variety of sense circuits.

FIG. 10 illustrates one embodiment of the invention 1000 where different cells are connected to a variety of sense circuits (1002-1 through 1002-n). For example, submatch line MLSL1 connects only cells 1010-1, and 1010-2 to sense circuit 1002-1. Since sense circuit 1002-1 only has a single input, this embodiment may speed detection of matches associated with cells 1010-1, and 1010-2. Sense circuit 1002-2 has two inputs MLSL2 and MLSL3 which couple cells 1010-5 and 1010-6 via MLSL2, and 10104 and 1010-7 via MLSL3. Sense circuit 1002-n is shown connected to cell 1010-8 and 1010-z via submatch line MLSLy, and 1010-9 is routed directly to sense circuit 1002-n. Cell 1010-3 is not connected to any of the sense circuits shown (1002-1 through 1002-n). In one embodiment cell 1010-3 may be connected to another subarray submatch line.

Figure 11:
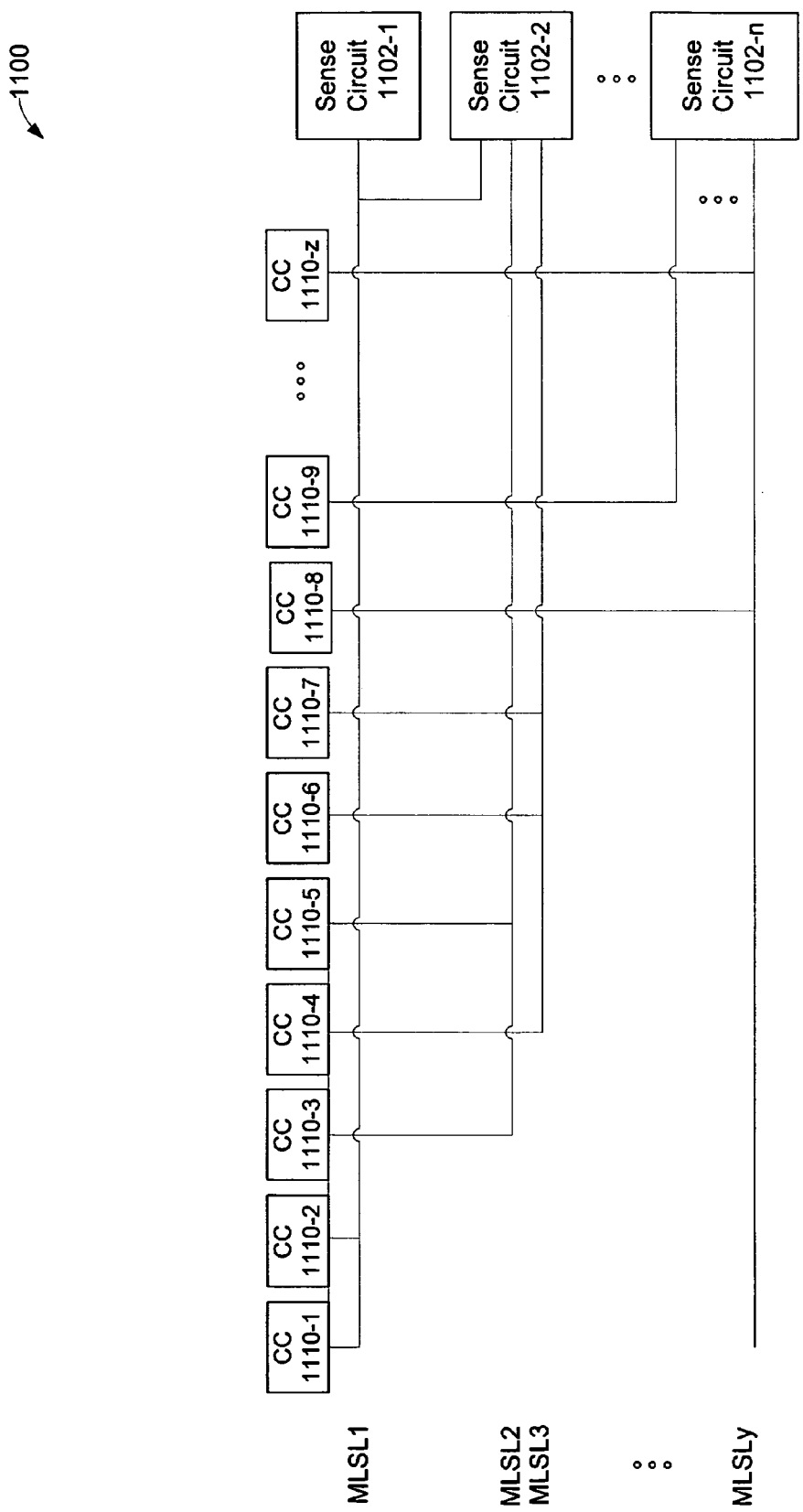
FIG. 11 illustrates one embodiment of the invention where a submatch line may be connected to a variety of sense circuits.

FIG. 11 illustrates one embodiment of the invention 1100 where a submatch line may be connected to a variety of sense circuits (1102-1 through 1102-n). For example, submatch line MLSL1 connects cells 1110-1, and 1110-2 to sense circuit 1102-1 and sense circuit 1102-2. Since sense circuit 1102-1 only has a single input, this embodiment may speed detection of matches associated with cells 1110-1, and 1110-2. Sense circuit 1102-2 has three inputs connecting to MLSL1, MLSL2, and MLSL3 which couple cells 1110-1, 1110-2 via MLSL1, 1110-3, and 1110-5 via MLSL2, and 11104, 1110-6, and 1110-7 via MLSL3. Sense circuit 1102-n is shown connected to cell 1110-8 and 1110-z via submatch line MLSLy, and 1110-9 is routed directly to sense circuit 1102-n. One of skill in the art will appreciate that by having different cells connected to different submatch lines that can then be connected in different combinations to different sense circuits allows for greater flexibility in performing matches.

The CAM cells (1110-1 through 1110-z) of FIG. 11, when physically implemented, for example, on an IC may be arranged in a row where CC 1110-1 is physically farther from Sense Circuit 1102-1 than CC 1110-z. If line MLSL1 is routed through (but not connected to) 1110-3 through 1110-z, line MLSL1 "bypasses" some cells. As disclosed below, bypass lines are used to accommodate this type of connection and routing.

Figure 12:
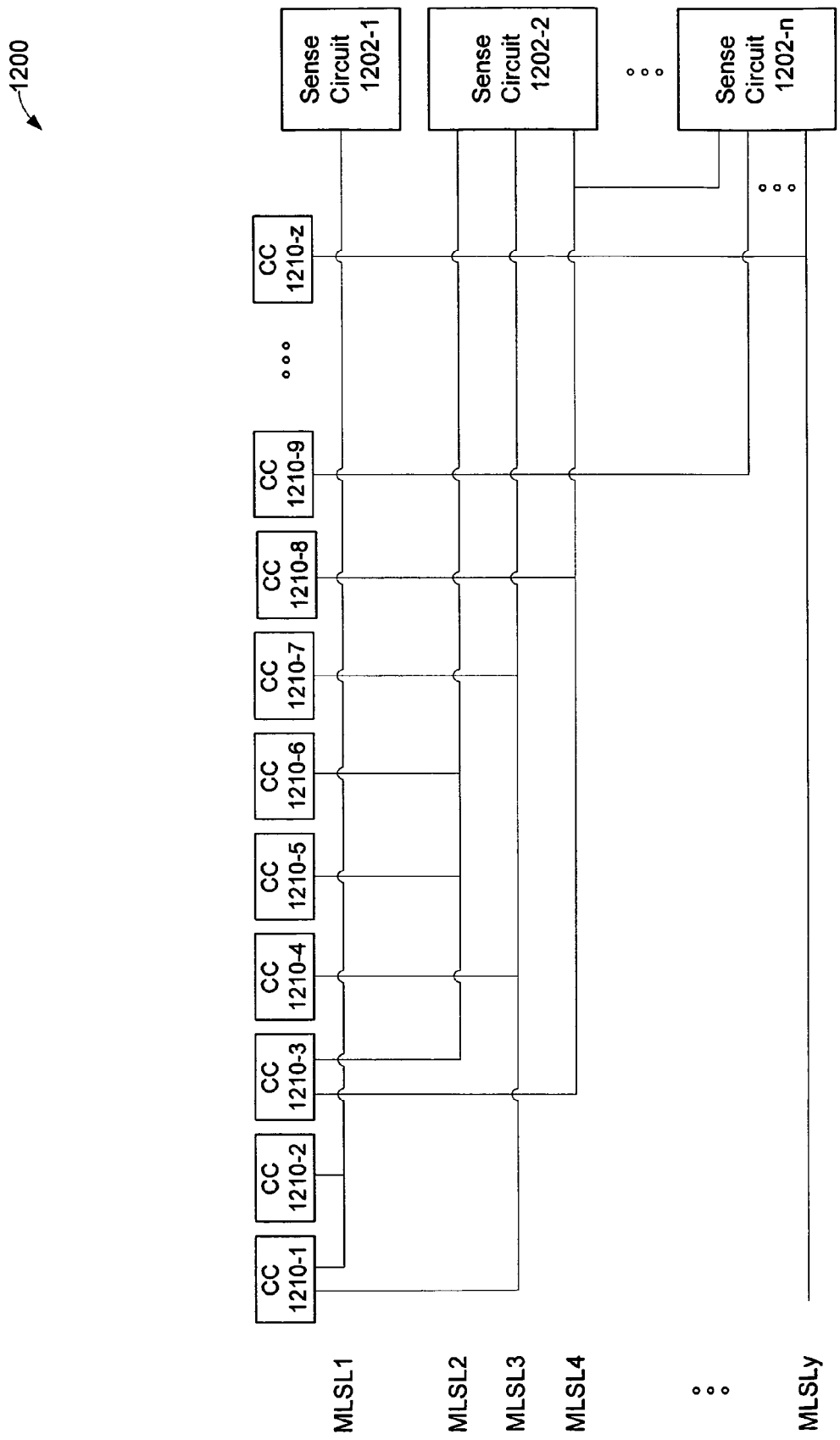
FIG. 12 illustrates one embodiment of the invention where a cell may be connected to more than one submatch line.

FIG. 12 illustrates one embodiment of the invention 1200 where a cell may be connected to more than one submatch line. For example, cell 1210-1 is connected to submatch line MLSL1 as well as MLSL3. Cell 1210-1 may have two logically different outputs or one output may be a buffered version of the other. While only two match outputs for a cell are illustrated in FIG. 12, one of skill in the art will recognize that any number of match outputs are possible and they may be indicative of a single match of contents or multiple matches of differing contents. Additionally, these multiple outputs may be connected to any number of submatch lines. MLSL1 connects cells 1210-1, and 1210-2 to sense circuit 1202-1. Sense circuit 1202-2 has three inputs MLSL2, MLSL3, and MLSL4 which couple cells 1210-3, 1210-5, and 1210-6 via MLSL2, 1210-1, 1210-4, and 1210-7 via MLSL3, and 1210-3 and 1210-8 via MLSL4. Sense circuit 1202-n is shown connected to cell 1210-9 directly, to 1210-z via submatch line MLSLy, and to 1210-3 and 1210-8 via MLSL4.

Figure 13:
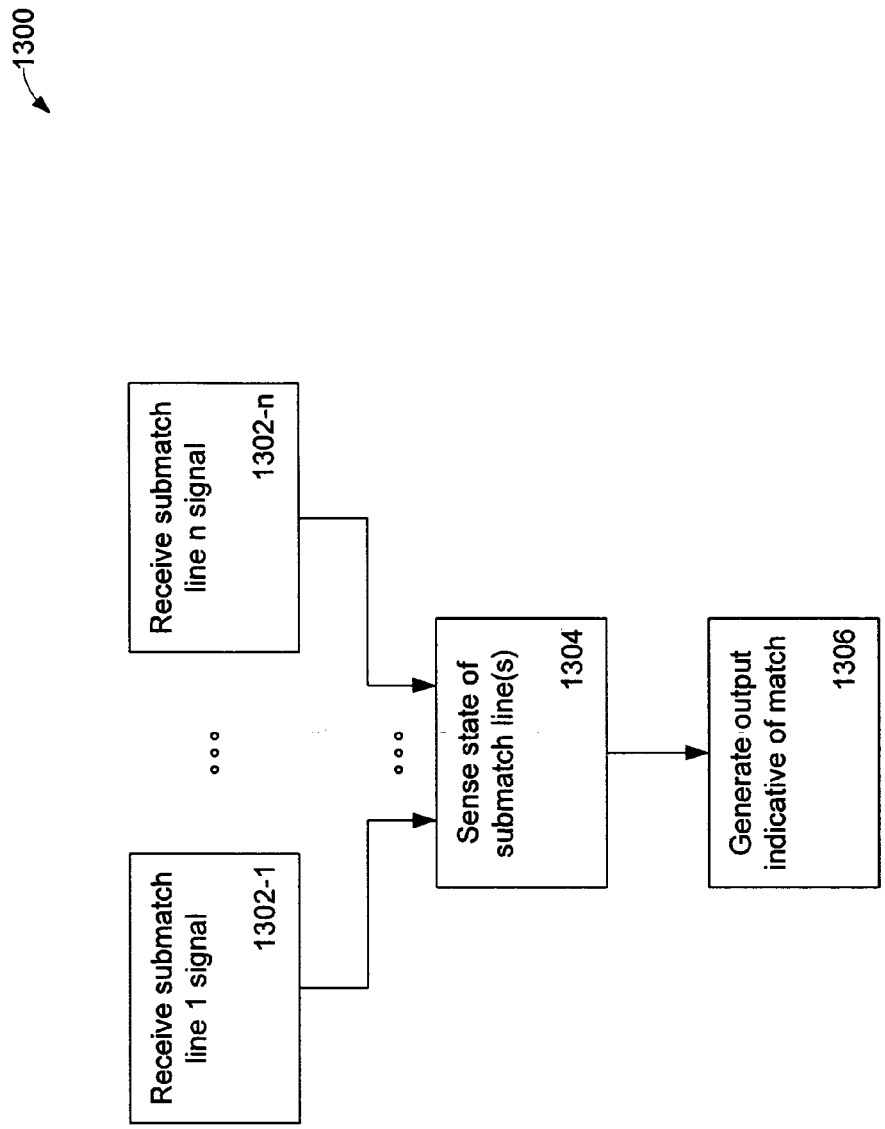
FIG. 13 illustrates one embodiment of the invention in flow chart form.

FIG. 13 illustrates one embodiment of the invention 1300 in flow chart form. At 1302-1 submatch line 1 signal is received. If there is more than one submatch line input, then additional inputs are received up to an arbitrary number n at 1302-n. At 1304 the state of the submatch line(s) is sensed and at 1306 an output is generated indicative of a match condition.

One of skill in the art will appreciate that in alternative embodiments of the invention other implementations are possible. For example, the submatch lines may not only be connected to different cells and sense circuits (such as sense amplifiers) but also use different interconnect layers on an IC.

While the present description has not detailed the internal workings of a CAM, one of skill in the art will appreciate that the present invention is applicable to regular CAMs as well as ternary CAMs (TCAMs), and CAM cells capable of comparing contents against more than one data comparison signal. For example, the present invention may be used where a single CAM cell is capable of generating a series of outputs resulting from a comparison of two or more compare data inputs. Thus, the illustration of one or more submatch lines is to be understood to include multiple submatch lines, as well as, the results of possible multiple comparisons.

Figure 14:
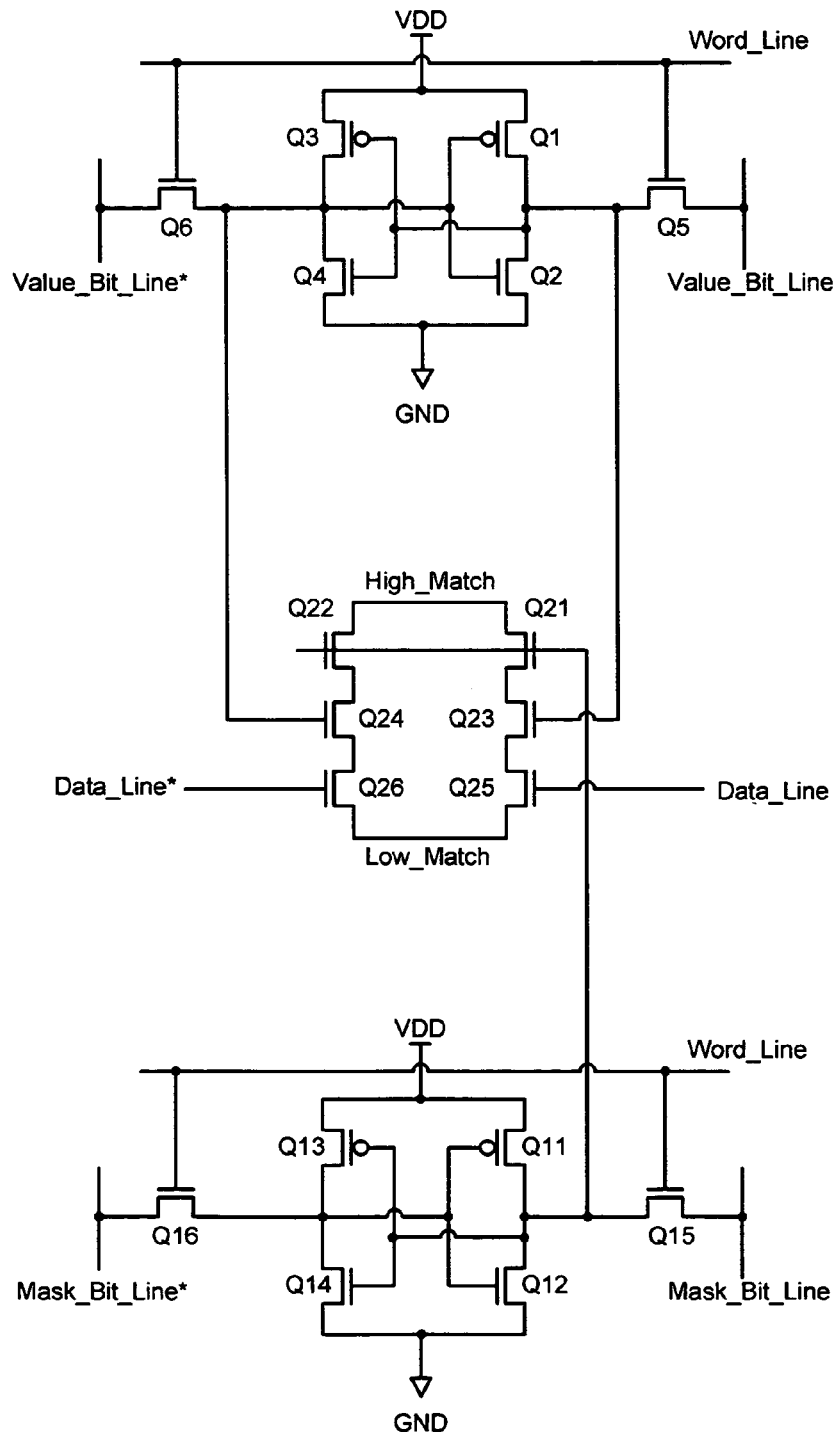
FIG. 14 illustrates one embodiment of the invention in schematic form.

FIG. 14 illustrates one embodiment of the invention in schematic form. 1400 illustrates a ternary CAM (TCAM) with high and low match lines. Transistors Q1 (PMOS), Q2 (NMOS), Q3 (PMOS), and Q4 (NMOS) form a memory cell. VDD is a source of positive voltage with respect to GND. Values of this memory cell (Q1–Q4) may be read/written by reading/writing the value of Value_Bit_Line and its complement Value_Bit_Line* through transistors Q5 and Q6 respectively when Word_Line is taken to a sufficient positive voltage.

Transistors Q11 (PMOS), Q12 (NMOS), Q13 (PMOS), and Q14 (NMOS) form a memory cell for holding a masking bit value. VDD is a source of positive voltage with respect to GND. Values of this masking bit cell (Q11–Q14) may be read/written by reading/writing the value of Mask_Bit_Line and its complement Mask_Bit_Line* through transistors Q15 and Q16 respectively when Word_Line is taken to a sufficient positive voltage.

Transistors Q21 (NMOS), Q22 (NMOS), Q23 (NMOS), Q24 (NMOS), Q25 (NMOS), and Q26 (NMOS) form a NXOR (negative XOR) circuit. The source of Q21 and the source of Q22 are connected to a High_Match line. The drain of Q26 and the drain of Q25 are connected to a Low_Match line. The gate of Q24 is connected to the source of Q4, and the gate of Q23 is connected to the source of Q2. The gate of Q25 is connected to a Data_Line and Q26 is connected to Data_Line*.

During a compare operation the data presented to the Data_Line and Data_Line* inputs is compared with the memory cell (Q1–Q4) contents via the NXOR circuit which will operate when the gate of Q22 and the gate of Q21, which are connected to the source of Q12, is at a sufficient positive voltage.

In FIG. 14 is shown a single High_Match. What is to be appreciated is that for different groups of TCAM cells multiple match lines are possible as discussed above. For example, in one embodiment, there may be a High_Match_1 line and a High_Match_2 line.

When a CAM is physically implemented there are a variety of considerations, such as, but not limited to, power, size, speed, etc. Additionally, there may be unwanted effects such as interference that may affect performance. This interference may come from a variety of sources, such as supply voltage variations, ground bounce, cross-coupling of signal lines, etc.

In one embodiment of the invention, a TCAM cell such as that illustrated in FIG. 14, when laid out on an IC will physically connect the NXOR logic via signal lines to the High_Match, the Low_Match, the Data_Line, and the Data_Line*. Due to the proximity of the lines it is possible for the Data_Line and Data_Line* to be coupled to the Low_Match and/or High_Match lines such that when the Low_Match and/or High_Match lines quickly transition from, for example, a high voltage to a lower voltage, then Data_Line and/or Data_Line* may also be coupled lower. This may lower the match cell (Q21–Q25) current which can affect the speed and/or reliability of operation. If Data_Line and Data_Line* are moved away from the NXOR logic area this reduces the wire to wire coupling and may improve the speed.

In one embodiment of the invention, the cross-coupling interference may be reduced by having a line, such as GND or VDD between the Data_Line ad the Data_Line*.

Figure 15:
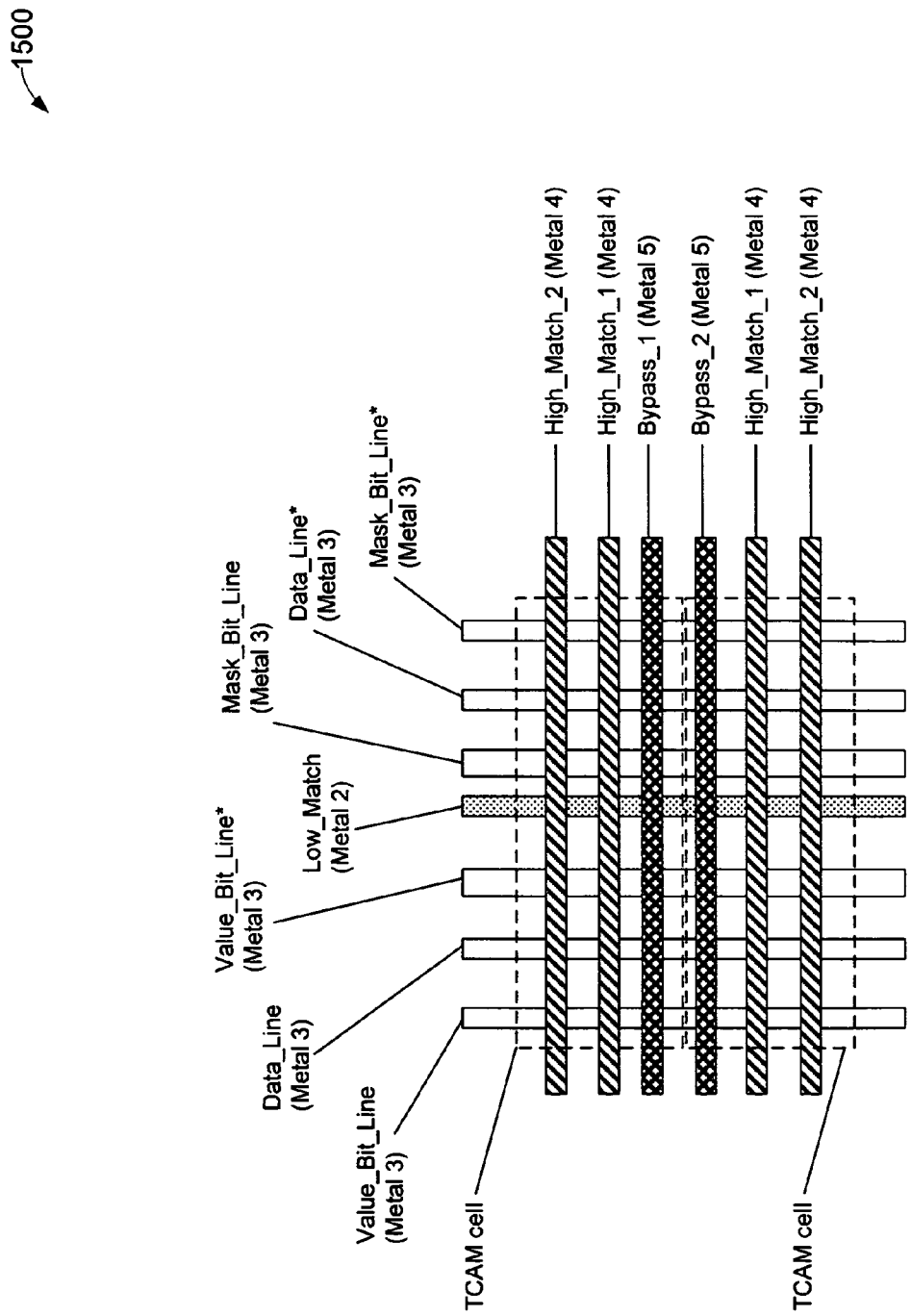
FIG. 15, FIG. 16, and FIG. 17 illustrate embodiments of the invention for cell routing.

FIG. 15 illustrates a layout 1500 for a TCAM cell showing two TCAM cells (each shown by dashed lines) for one embodiment of the invention. For illustrative purposes only straight metal lines are shown, and not interconnects (such as vias), or short jogs of the metal lines. Each dashed line box indicates a single TCAM cell. This single TCAM cell may be repeated to produce a group of cells. Additionally for illustrative purposes, example metal layers for this embodiment are denoted. Here on metal layer 2 is Low_Match. Running substantially parallel to Low_Match, from left to right, on metal layer 3 is Value_Bit_Line, Data_Line, Value_Bit_Line*, Mask_Bit_Line, Data_Line*, and Mask_Bit_Line*. Running substantially perpendicular to Low_Match, from top to bottom, is High_Match_2 on metal 4, High_Match_1 on metal 4, Bypass_1 on metal 5, Bypass_2 on metal 5, High_Match_1 on metal 4, and High_Match_2 on metal 4.

Figure 1:
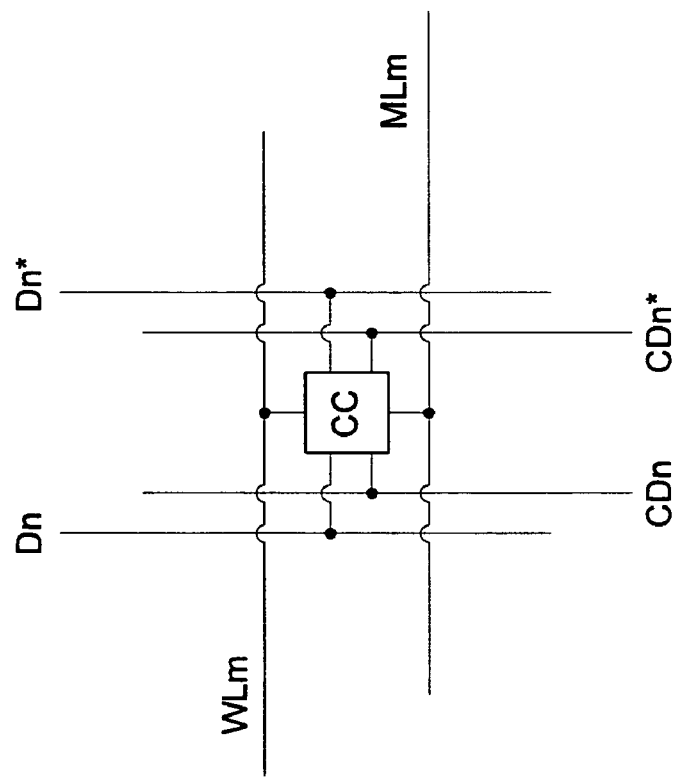
FIG. 1, FIG. 2, FIG. 3, FIG. 4, FIG. 5, and FIG. 6 illustrate some current approaches.
Figure 2:
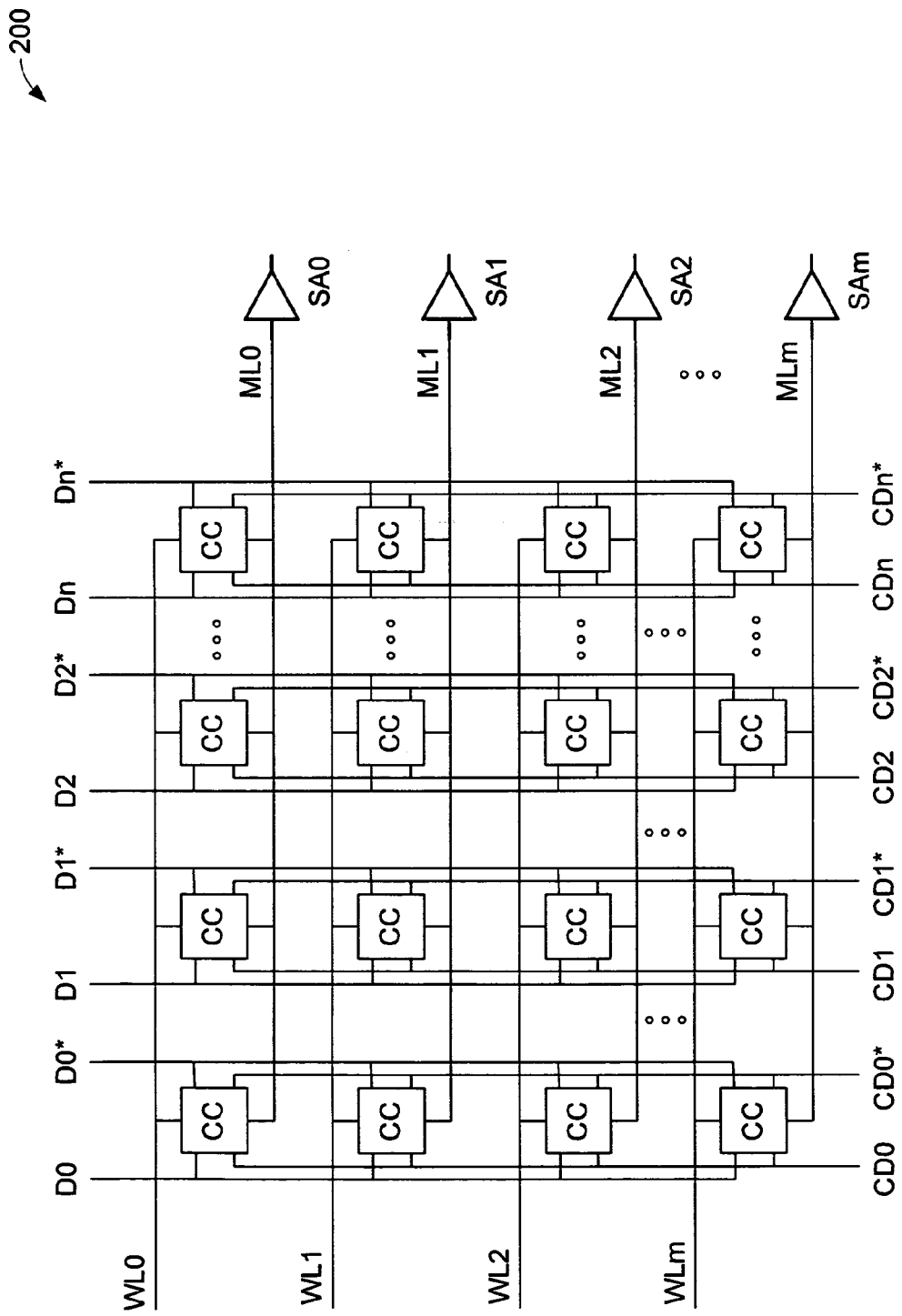
Figure 3:
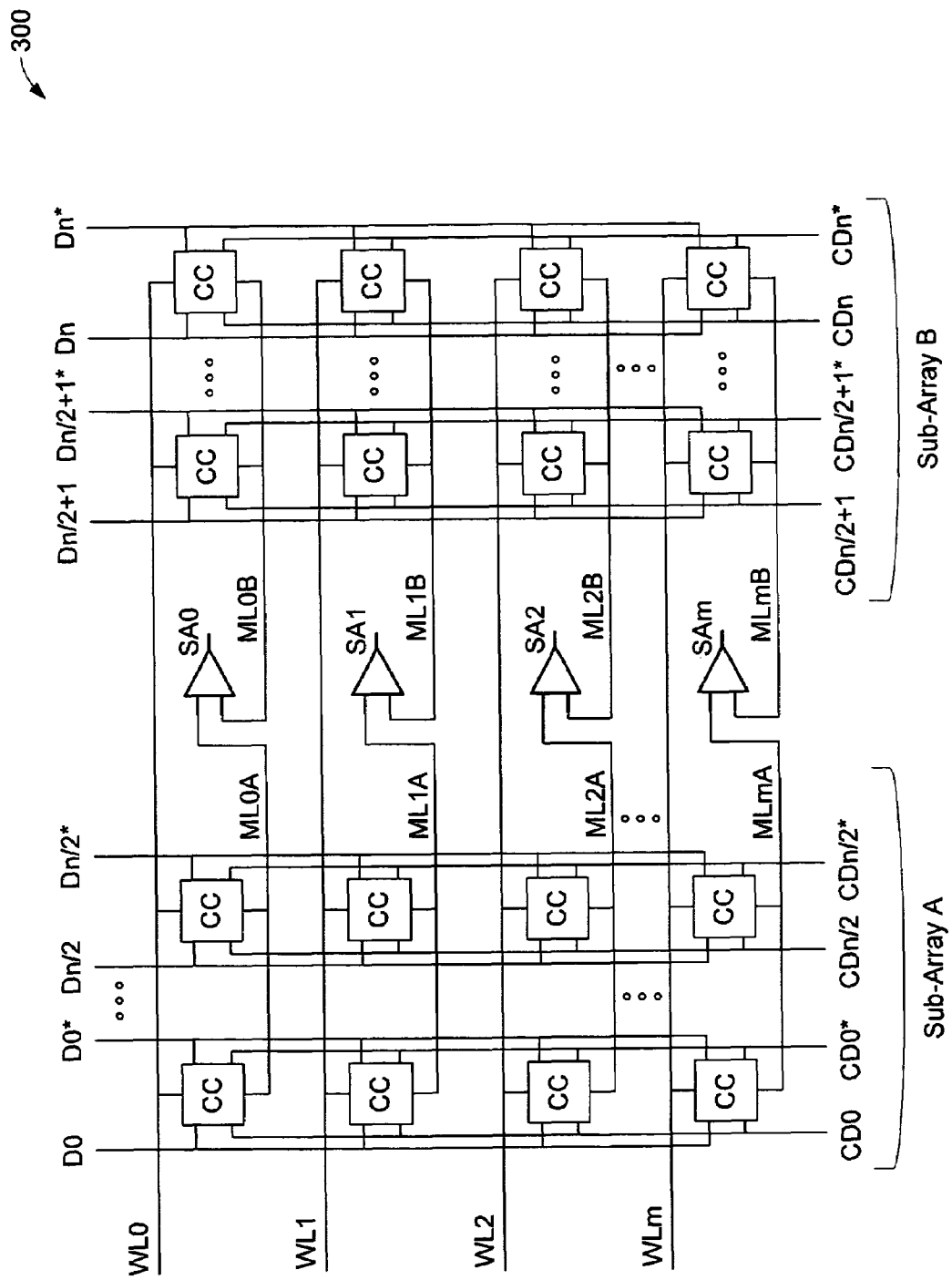
Figure 4:
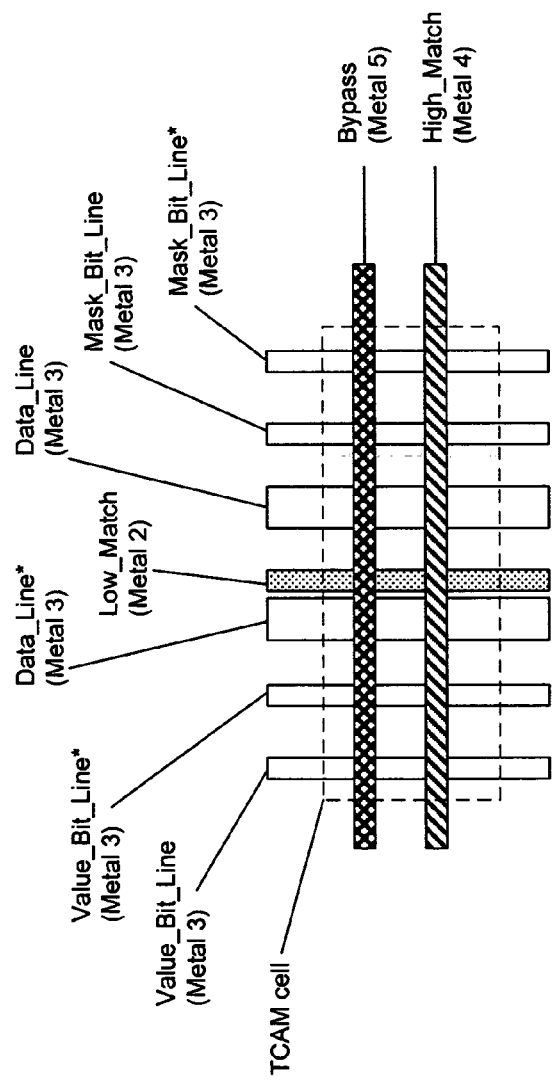

As will be noted in FIG. 15 Low_Match on metal 2 runs substantially parallel and physically close to Value_Bit_Line* on metal 3 and Mask_Bit_Line on metal 3 which separates Low_Match some additional distance (as compared with FIG. 4) from Data_Line on metal 3 and Data_Line* on metal 3. This additional distance, as compared with, for example that of FIG. 4, leads to reduced capacitive and inductive coupling between the Low_Match and Data_Line and Data_Line* lines.

Additionally, FIG. 15 illustrates two high match lines High_Match_1 and High_Match_2. Since there are two high match lines, for a given array of cell sizes, they need only connect to, for example, half the number of cells as that illustrated in FIG. 4 for a similar array size. Thus, the capacitive load on each match line may be less than that of using a single match line.

Additionally, FIG. 15 illustrates two bypass lines Bypass_1 and Bypass_2. Since there are two bypass lines, for a given array of cells having a sense amplifier, they need only connect to, for example, half the number of cells as that illustrated in FIG. 4. Thus, the capacitive load on each bypass line may be less than that of using a single bypass line.

Other embodiments of the present invention for routing of a TCAM cell are possible for reducing cross-coupled interference. For example, other lines such as VDD and/or GND may be positioned between, for example, the Low_Match line and Data_Line and Data_Line*.

Figure 16:
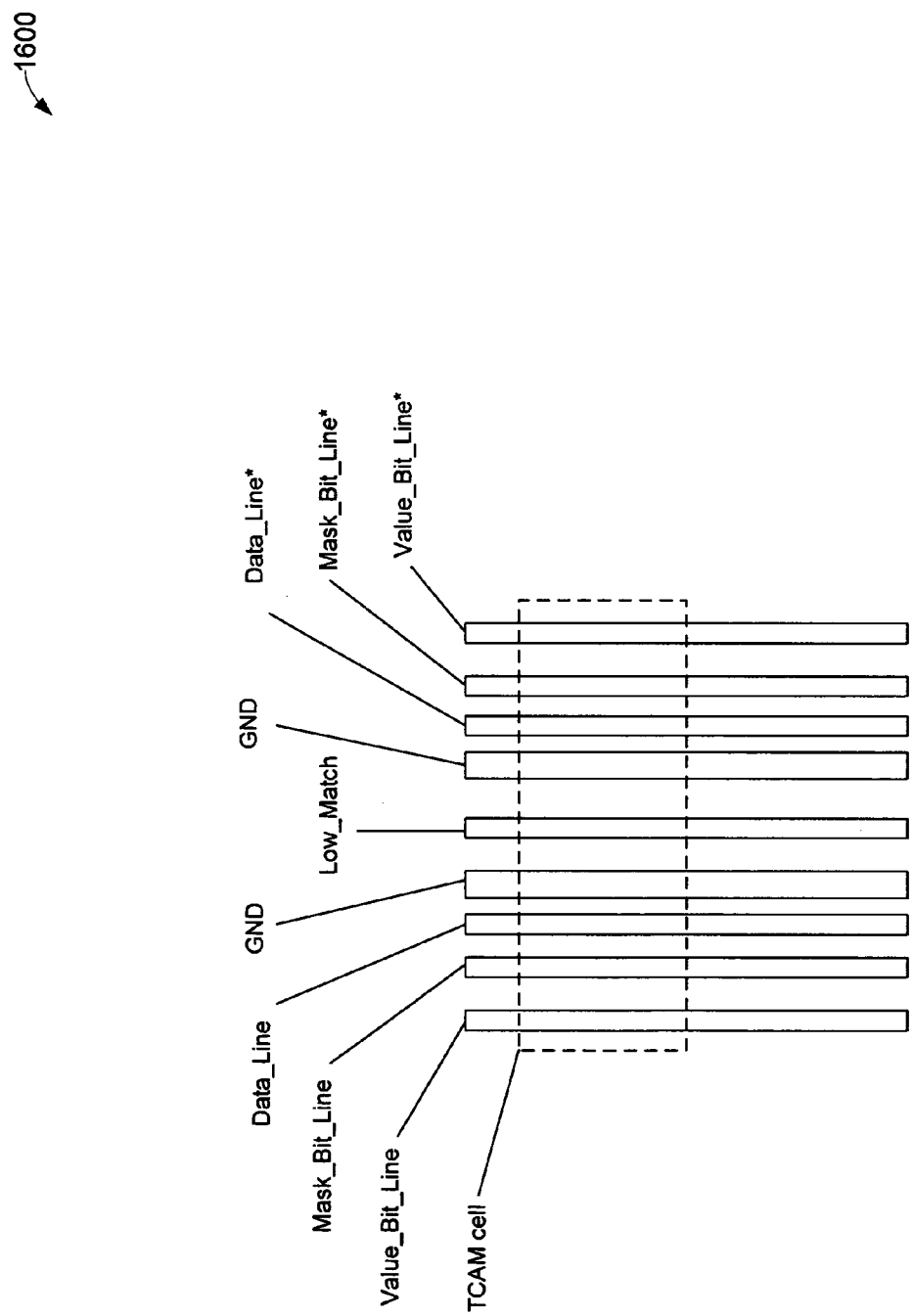

FIG. 16 illustrates one embodiment 1400 where two GND lines, one on each side of Low_Match are between Low_Match and Data_Line and Data_Line*. For illustrative purposes, the metal layers, high match lines, and bypass lines are not shown. One of skill in the art will appreciate that the routes (signal lines) may be on any layer as determined by a designer.

Figure 17:
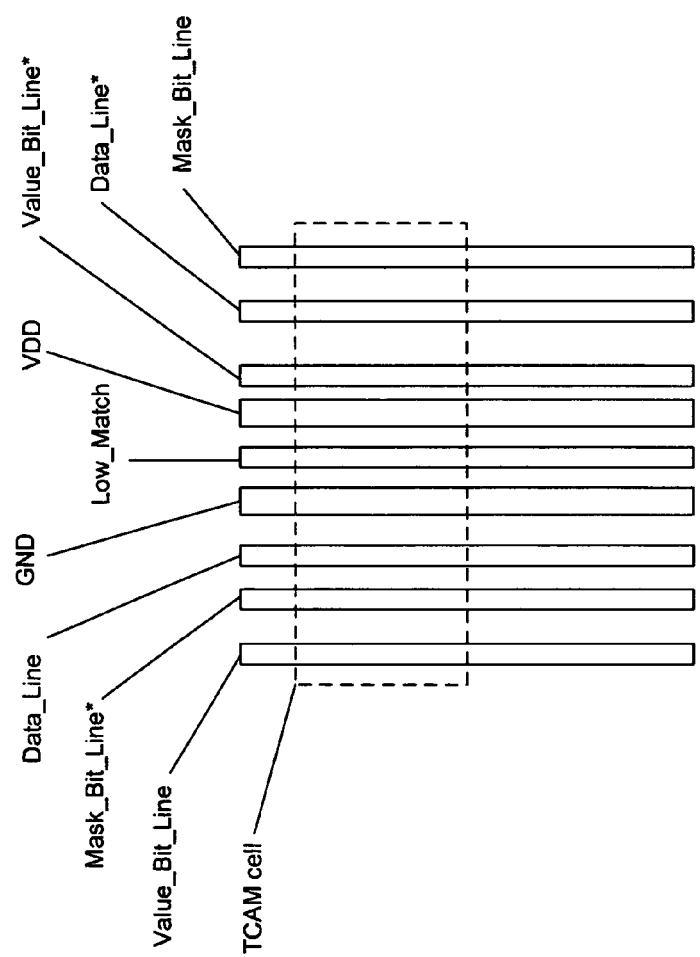

One of skill in the art will appreciate that many variations of the order of the signal routings may be made to reduce cross-coupling. For example, more than one signal line may be routed between Low_Match and Data_Line and/or Data_Line*. FIG. 17 illustrates one such arrangement 1700. Here GND is between Low-Match and Data_Line, and VDD and Value_Bit_Line* is between Low-Match and Data_Line*.

One of skill in the art will note that the preceding discussion dealt primarily with cross-coupling between substantially parallel lines. There are additional sources of cross-coupling as well. For example, in FIG. 15 there is cross-coupling between the vertically oriented lines and the horizontally oriented lines. Additionally, there is cross-coupling associated with where a match pickup (i.e. connection) occurs. That is, where a via is actually placed on a match line to connect to a CAM cell device. For example, a via used to connect the source of transistor Q22 in FIG. 14 to a High_Match line (shown schematically in FIG. 14) physically in FIG. 15 influences cross-coupling to, for example, the Data_Line in FIG. 15.

Figure 18:
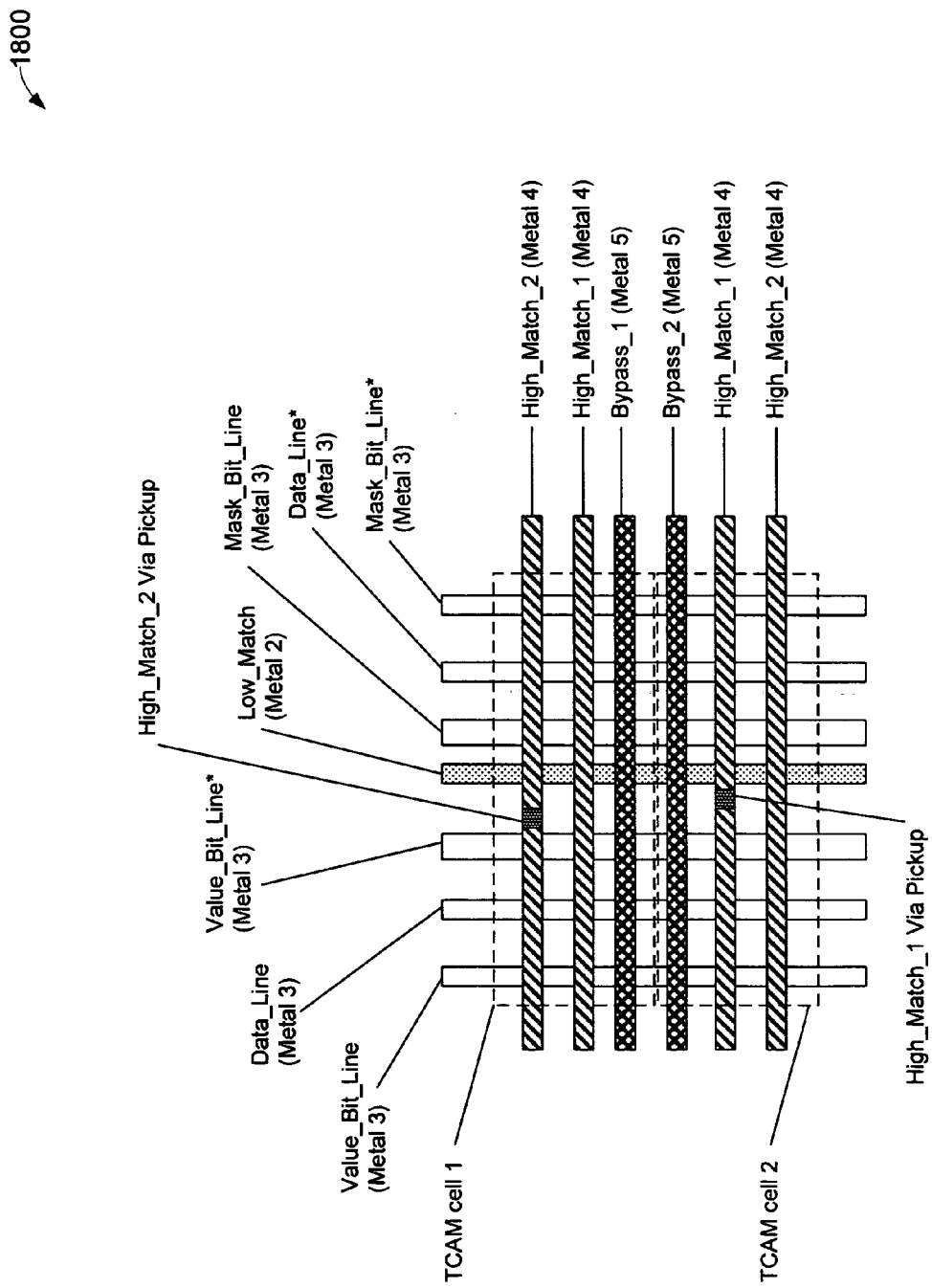
FIG. 18 illustrates a layout for a TCAM cell showing two TCAM cells for one embodiment of the invention.

FIG. 18 illustrates a layout 1800 for a TCAM cell showing two TCAM cells (TCAM cell 1 and TCAM cell 2) (each shown by dashed lines) for one embodiment of the invention. For illustrative purposes only straight metal lines are shown, and only two via interconnects High_Match_2 Via Pickup, and High_Match_1 Via Pickup are shown. Each dashed line box indicates a single TCAM cell. This single TCAM cell may be repeated to produce a group of cells. Additionally for illustrative purposes, example metal layers for this embodiment are denoted. Here on metal layer 2 is Low_Match. Running substantially parallel to Low_Match, from left to right, on metal layer 3 is Value_Bit_Line, Data_Line, Value_Bit_Line*, Mask_Bit-Line, Data_Line*, and Mask_Bit_Line*. Running substantially perpendicular to Low_Match, from top to bottom, is High_Match_2 on metal 4, High_Match_1 on metal 4, Bypass_1 on metal 5, Bypass_2 on metal 5, High_Match_1 on metal 4, and High_Match_2 on metal 4.

Figure 5:
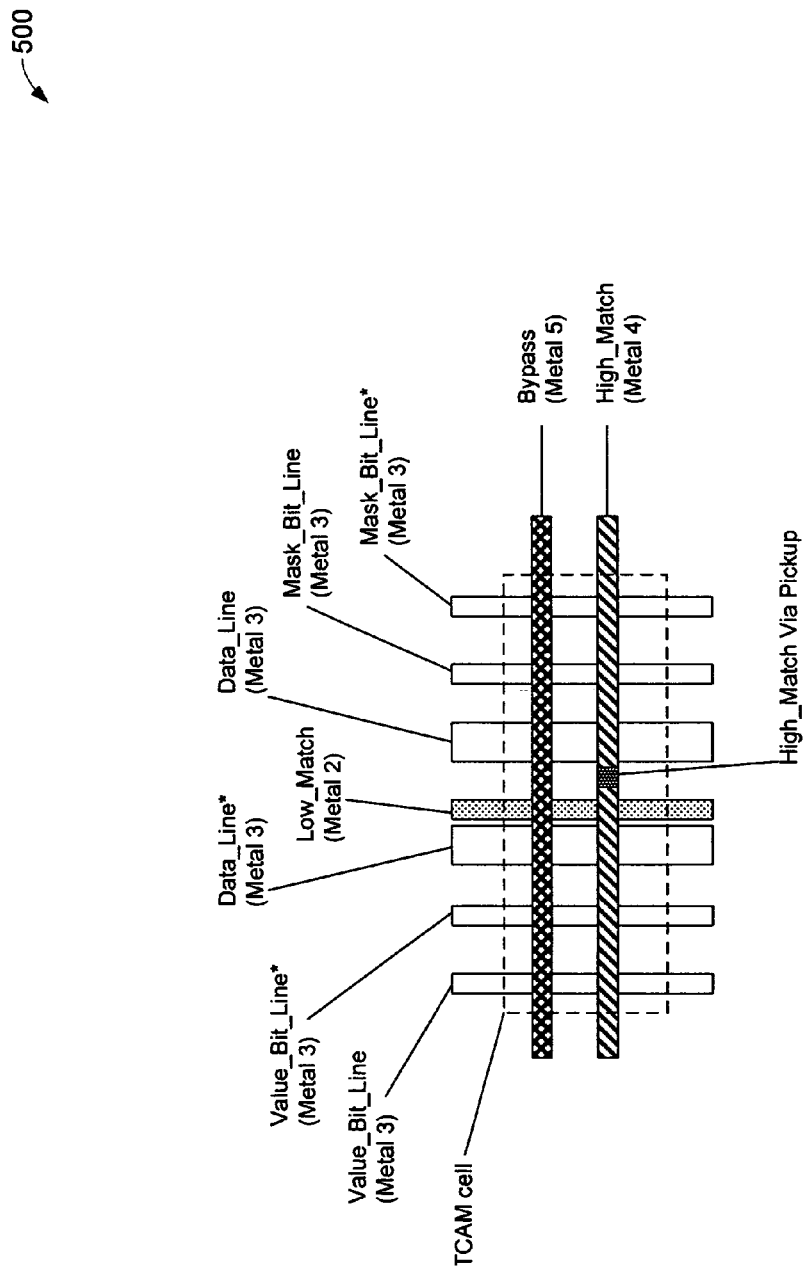
Figure 6:
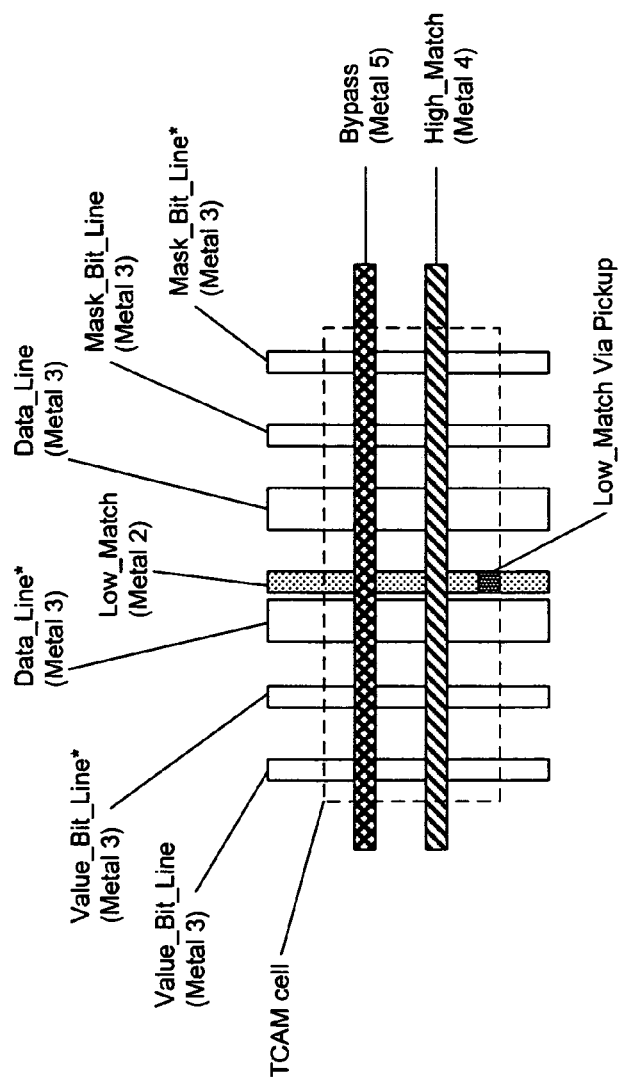

Via interconnect High_Match_2 Via Pickup in TCAM cell 1 is shown as a dark dotted box on High_Match_2 and may, for illustrative purposes, be considered to extend normal to the paper surface downward to connect to, for example, the source of Q22 in FIG. 14. High_Match_2 Via Pickup traverses the metal layers (including metal 3) as it connects to a device in the TCAM cell and is physically separated from Data_Line on metal 3 by Value-Bit_Line* on metal 3, and from Data_Line* on metal 3 by Mask-Bit_Line on metal 3. This separation, as compared with FIG. 16, leads to less capacitive and inductive coupling between High_Match_2 Via Pickup and Data_Line, and High_Match_2 Via Pickup and Data_Line*. Additionally, in the embodiment illustrated in FIG. 18, as compared with FIG. 5, the match pickup (High_Match Via Pickup in FIG. 5, High_ Match_2 Via Pickup in FIG. 18) is located a farther distance from the Data_Line and Data_Line*. This increased distance leads to less capacitive and inductive coupling between High_Match_2 Via Pickup and Data_ Line, and High_Match_2 Via Pickup and Data_Line*.

Via interconnect High_Match_1 Via Pickup in TCAM cell 2 is shown as a dark dotted box on High_Match_1 and may, for illustrative purposes, be considered to extend normal to the paper surface downward to connect to, for example, the source of Q22 in FIG. 14 for TCAM cell 2. High_Match_1 Via Pickup traverses the metal layers (including metal 3) as it connects to a device in the TCAM cell and is physically separated from Data_Line on metal 3 by Value_Bit_Line* on metal 3, and from Data_Line* on metal 3 by Mask_Bit_Line on metal 3. This separation, as compared with FIG. 5, leads to less capacitive and inductive coupling between High_Match_1 Via Pickup and Data_Line, and High_Match_1 Via Pickup and Data_Line*. Additionally, in the embodiment illustrated in FIG. 18, as compared with FIG. 5, the match pickup (High_Match Via Pickup in FIG. 5, High_Match_1 Via Pickup in FIG. 18) is located a farther distance from the Data_Line and Data_Line*. This increased distance leads to less capacitive and inductive coupling between High_Match_1 Via Pickup and Data_Line, and High_Match_1 Via Pickup and Data_Line*.

Additionally, FIG. 18 illustrates two high match lines High_Match_1 and High_Match_2. Since there are two high match lines, for a given array of cell sizes, they need only connect to, for example, half the number of cells as that illustrated in FIG. 4 for a similar array size. Thus, the capacitive load on each match line may be less than that of using a single match line.

Additionally, FIG. 18 illustrates two bypass lines Bypass_1 and Bypass_2. Since there are two bypass lines, for a given array of cells having a sense amplifier, they need only connect to, for example, half the number of cells as that illustrated in FIG. 4. Thus, the capacitive load on each bypass line may be less than that of using a single bypass line.

Figure 19:
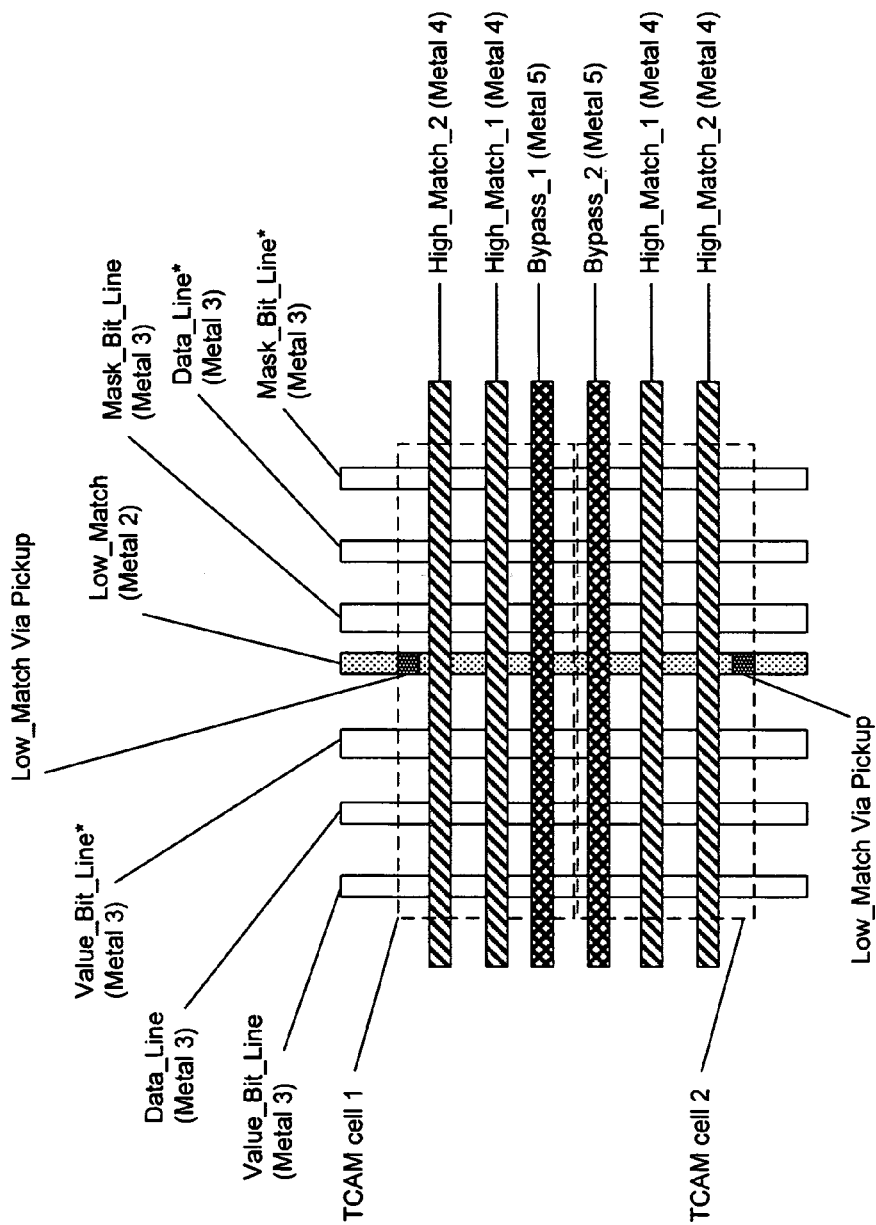
FIG. 19 illustrates a layout for a TCAM cell showing two TCAM cells and a Low Match pickup for one embodiment of the invention.

FIG. 19 illustrates a layout 1900 for a TCAM cell showing two TCAM cells (TCAM cell 1 and TCAM cell 2) (each shown by dashed lines) for one embodiment of the invention. For illustrative purposes only straight metal lines are shown, and only two via interconnects Low_Match Via Pickup are shown. Each dashed line box indicates a single TCAM cell. This single TCAM cell may be repeated to produce a group of cells. Additionally for illustrative purposes, example metal layers for this embodiment are denoted. Here on metal layer 2 is Low_Match. Running substantially parallel to Low_Match, from left to right, on metal layer 3 is Value_Bit_Line, Data_Line, Value_Bit_Line*, Mask_Bit_Line, Data_Line*, and Mask_Bit_Line*. Running substantially perpendicular to Low_Match, from top to bottom, is High_Match_2 on metal 4, High_Match_1 on metal 4, Bypass_1 on metal 5, Bypass_2 on metal 5, High_Match_1 on metal 4, and High_Match_2 on metal 4.

Via interconnect Low_Match_2 Via Pickup in TCAM cell 1 and TCAM cell 2 is shown as a dark dotted box on Low_Match and may, for illustrative purposes, be considered to extend normal to the paper surface downward to connect to, for example, the drain of Q26 in FIG. 14 for each TCAM cell. Low_Match Via Pickup traverses the metal layers (including metal 1) as it connects to a device in the TCAM cell and is physically separated from Data_Line on metal 3 by Value_Bit_Line* on metal 3, and from Data_Line* on metal 3 by Mask_Bit_Line on metal 3. This separation, as compared with FIG. 16, leads to less capacitive and inductive coupling between Low_Match Via Pickup and Data_Line, and Low_Match Via Pickup and Data_Line*. Additionally, in the embodiment illustrated in FIG. 19, as compared with FIG. 17, the Low_Match Via Pickup is located a farther distance from the Data_Line and Data_Line*. This increased distance leads to less capacitive and inductive coupling between Low_Match Via Pickup and Data_Line, and Low_Match Via Pickup and Data_Line*.

One of skill in the art will appreciate that cross-coupling between lines may be reduced by intervening line(s) and/or greater distance between lines. Thus, the present invention, in other embodiments, may have intervening lines on one or more layers, lines layers apart, as well as lines on different layers.

The preceding discussion dealt primarily with match line vias and cross-coupling. One of skill in the art will appreciate that via cross-coupling applies to any via, not just match line vias. For example, the Data_Line and Data_Line* as illustrated in FIG. 19 will have vias that connect the respective lines to, for example, the gate of Q25 and Q26 as shown in FIG. 14.

Figure 20:
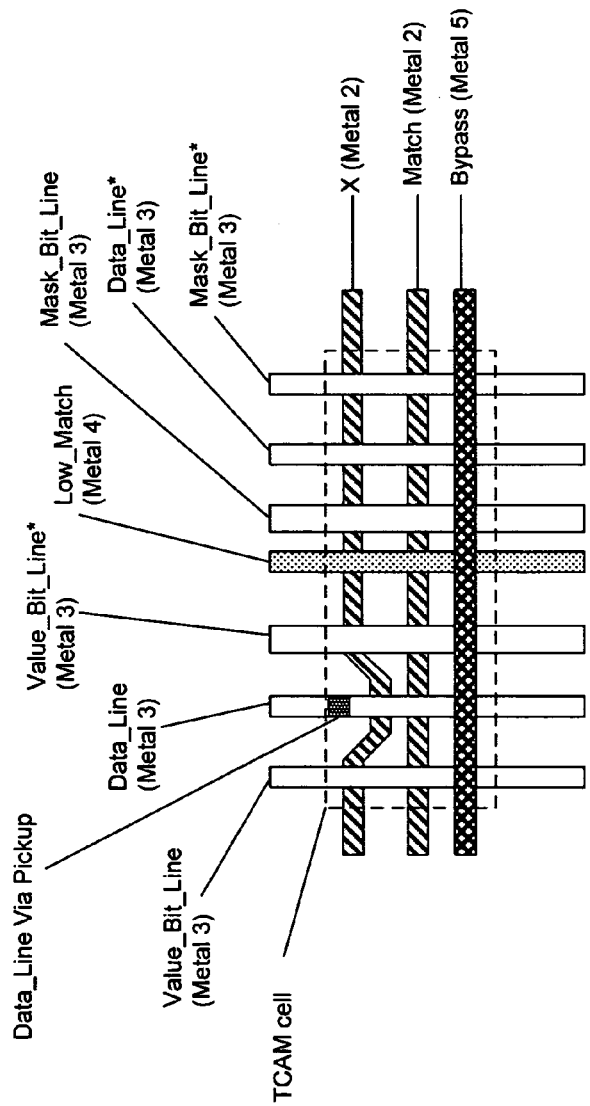
FIG. 20 illustrates one embodiment of the invention showing a single data line via pickup.

FIG. 20 illustrates one embodiment of the invention 2000 showing a single Data_Line via (Data_Line Via Pickup). The Data_Line via (Data_Line Via Pickup) connects between a device on the substrate and metal 3 where the Data_Line is routed. TCAM cell as indicated by the dashed lines has, going left to right, and top to bottom: Value_Bit_Line (metal 3), Data_Line Via Pickup point which is on Data_Line (metal 3), Value_Bit_Line* (metal 3), Low_Match (metal 4), Mask_Bit_Line (metal 3), Data_Line* (metal 3), Mask_Bit_Line* (metal 3), an arbitrary line denoted X (metal 2), Match (metal 2), and Bypass (metal 5).

Figure 21:
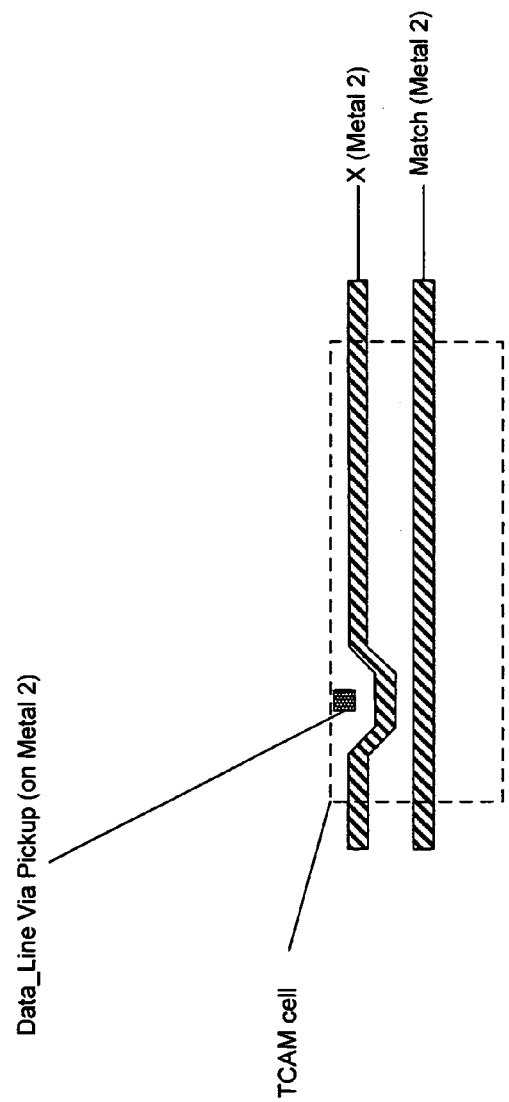
FIG. 21 illustrates one embodiment of the invention showing only metal 2 for the TCAM cell illustrated in FIG. 20.

FIG. 21 illustrates one embodiment of the invention 2100 showing only metal 2 for the TCAM cell illustrated in FIG. 20. Here on metal 2 is the Data_Line Via Pickup via, the Match line, and line X. As may be seen, line X is between the Data_Line Via Pickup via and the Match line. Having X between the Data_Line Via Pickup via and the Match line reduces the cross-coupling between the Data_Line Via Pickup via and the Match line.

One of skill in the art will appreciate that this same approach to placing a route between other routes and/or between vias and routes may be used to reduce cross-coupling between lines as needed.

Thus a method and apparatus for a CAM with reduced cross-coupling interference have been described.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory, and/or logic circuitry. These algorithmic descriptions and representations are the means used by those of skill in the arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities.

Further, any of the methods according to the present invention can be implemented in hard-wired circuitry, by programmable logic, or by any combination of hardware and software.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "sense amplifier" or "sense circuit" or similar phrases are to be understood to refer to devices used to sense the state of signals (such as voltage). So, for example, a sense amplifier may be a sense circuit based on devices that is used to sense the voltage or logic level of a signal or to compare one or more signals to each other and/or a reference. The phrases are often used interchangeably and understood by one of skill in the art in relation to the context in which they are used. For example, an AND logic function whose inputs are connected to, for example, match lines where a logic high denotes a match, would produce a high signal when there is a match, and a low signal when there is not a match.

As used in the description the asterisk symbol (*) following a signal name is used to indicate an inverted or complemented version of the non-asterisked signal name. For example, if Data_Line is moving from a low voltage to a higher voltage, Data_Line* will be moving from a higher voltage to a lower voltage. Because of timing delays, voltage drops, etc. the two signals may not change at the exact same time or to the same exact levels. Additionally, a signal and its complement are often called a differential pair to indicate that the signals when signaling information will generally move in opposite directions, for example, one may move lower in voltage while the other increases in voltage. Thus, the use of, "complement of X" or "substantially inverted version of X" where X is additional text, or use of the asterisk, or the word "bar" following a signal name, or similar phrases, are to be understood to refer to signals that will generally be moving in different directions when communicating a signal. One of skill in the art understands this.

As used in this description, "via", "pickup via", or similar phrases are to be understood as connections between two points. A "via" is generally understood, in an integrated circuit (IC) context, as a technique for connecting a point at a lower layer of an IC to a higher layer of an IC. This often involves traversing layers and the use of "vertical" structures, such as, but not limited to, plugs, layer N metal to layer N+1 metal connections, etc. One of skill in the art understands this.

As used in this description, "line(s) between X line and Y line", or similar phrases are to be understood as intervening lines when viewed normal to an integrated circuit surface. It specifically does not require that the lines all be on the same layer. For example, if viewed from above an IC, left to right on layer 1 are vertical lines labeled A, B, and C, then it is to be understood that B is between A and C and intervenes between A and C. Likewise, if viewed from above an IC, left to right are vertical lines labeled A (on layer 1), B (on layer 2), and C (on layer 1), then it is to be understood that B is again between A and C and intervenes between A and C.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for a CAM with reduced cross-coupling interference have been described.

What is claimed is:

1. A method comprising;
    placing one or more signal lines substantially between a match line and a data line in a CAM memory cell.

2. The method of claim 1 further comprising placing a second set of one or more signal lines substantially between said match line and a substantially inverted version of said data line in said CAM memory cell.

3. The method of claim 2 wherein said one or more signal lines and said second set of one or more signal lines are not the same signal lines.

4. The method of claim 2 wherein said one or more signal lines and said second set of one or more signal lines are selected from the group consisting of a positive voltage supply, a ground signal, a value bit, a data bit, a mask bit, a substantially inverted version of said value bit, a substantially inverted version of said data bit, and a substantially inverted version of said mask bit.

5. The method of claim 4 wherein said match line is selected from the group consisting of a low match line, and a high match line.

6. A method comprising:
    coupling less than all memory cells in a row of a sub-array of a CAM to a same sense amplifier;
    coupling any remaining said less than all memory cells to a second sense amplifier and;
    routing a data line substantially parallel to a match line, but not directly adjacent to said match line.

7. A method comprising:
    coupling less than all memory cells in a row of a sub-array of a CAM to a first input of a multiple input sense amplifier;

coupling any remaining said less than all memory cells to one or more inputs other than said first input of said sense amplifier;

routing one or more signal lines between a low match line and a data line; and routing one or more signal lines between said low match line and a complement of said data line.

8. The method of claim 7 wherein said multiple input sense amplifier is a two input sense amplifier.

9. The method of claim 8 wherein said one or more signal lines is selected from the group consisting of a voltage supply, a ground signal, a value bit, a data bit, a mask bit, a complement of said value bit, a complement of said data bit, and a complement of said mask bit.

10. A method for connecting cells in a row in a CAM sub-array, the method comprising:

separating a row match line into several submatch lines;

coupling less than all said cells in said row to a same sense amplifier; and placing a trace between a low match line and a data line.

11. The method of claim 10 further comprising:

coupling any remaining said less than all said cells to one or more sense amplifiers; and placing a trace between said low match line and a complement of said data line.

12. The method of claim 11 wherein said placing a trace is achieved using a substantially same set of interconnect layers.

13. The method of claim 11 wherein said placing a trace is achieved using a substantially different set of interconnect layers.

14. The method of claim 10 wherein said low match line and said data line are substantially parallel in routing.

15. A method for constructing an integrated circuit (IC) content addressable memory (CAM) comprising:

connecting less than all memory cells in a row of a sub-array of a CAM to a same sense amplifier;

connecting any remaining said less than all memory cells in said row of said sub-array of said CAM to a second sense amplifier; and routing one or more signal lines between a match line and a compare data line and a complement of said compare data line associated with said memory cells in said row of said sub-array of said CAM.

16. The method of claim 15 wherein said connecting and routing uses a substantially different set of interconnect layers.

17. An apparatus comprising:

a plurality of memory cells arranged in a row;

one or more match lines running substantially parallel to said row;

means for connecting two or more subsets of said plurality of memory cells to said one or more match lines; and one or more low match lines running substantially perpendicular to said row;

one or more traces interspersed between said one or more low match lines and one or more data lines running substantially parallel to said one or more low match lines.

18. The apparatus of claim 17 wherein said plurality is a sub-array.

19. The apparatus of claim 17 wherein said one or more match lines connect to one or more sense amplifiers.

20. The apparatus of claim 17 wherein said one or more match lines connect to one or more inputs of a sense amplifier.

21. The apparatus of claim 17 wherein said means for connecting uses a substantially same set of integrated circuit interconnect layers.

22. The apparatus of claim 17 wherein said means for connecting uses a substantially different set of integrated circuit interconnect layers.

23. The apparatus of claim 17 wherein said means for connecting uses a same integrated circuit interconnect layer for a majority of distance of said one or more match lines.

24. The apparatus of claim 17 wherein said means for connecting uses a different integrated circuit interconnect layer for a majority of distance of said one or more match lines.

25. An apparatus comprising:

means for connecting memory cells in a row to two or more high match lines; and means for routing a trace between a low match line and a data line.

26. The apparatus of claim 25 wherein less than all of said memory cells in said row are connected to a first high match line.

27. The apparatus of claim 26 wherein remaining less than all of said memory cells in said row are connected to one or more high match lines.

28. The apparatus of claim 27 further comprising:

an integrated circuit containing said memory cells in a row; and said connection to said first high match line is through a substantially same set of integrated circuit interconnect layers as said connection to said one or more high match lines.

29. The apparatus of claim 28 further comprising said first high match line connected to a first amplifier and said one or more high match lines connected to one or more amplifiers.

30. The apparatus of claim 28 further comprising said first high match line connected to a first input of an N input amplifier and each said one or more high match lines connected to one or more inputs of said N input amplifier.

31. The apparatus of claim 29 wherein said connection to said first amplifier is through a substantially same set of integrated circuit interconnect layers as said connection to said one or more amplifiers.

32. The apparatus of claim 29 wherein said connection to said first amplifier is through a substantially different set of integrated circuit interconnect layers as said connection to said one or more amplifiers.

33. The apparatus of claim 27 further comprising:

an integrated circuit containing said memory cells in a row; and said connection to said first high match line is through a substantially different set of integrated circuit interconnect layers as said connection to said one or more high match lines.

34. The apparatus of claim 33 further comprising said first high match line connected to a first amplifier and said one or more high match lines connected to one or more amplifiers.

35. The apparatus of claim 34 wherein said connection to said first amplifier is through a substantially same set of integrated circuit interconnect layers as said connection to said one or more amplifiers.

36. The apparatus of claim 34 wherein said connection to said first amplifier is through a substantially different set of integrated circuit interconnect layers as said connection to said one or more amplifiers.

37. A CAM comprising:
cells arranged in a row wherein less than all of said cells in said row are in communication with a single submatch line;
a first match line substantially parallel with said row and in communication with one or more said cells; and
a second match line in communication with one or more said cells.

38. The CAM of claim 37 further comprising one or more submatch lines in communication with any remaining cells not in communication with said single submatch line.

39. A machine-readable medium having stored thereon information representing the apparatus of claim 37.

40. The CAM of claim 38 wherein a particular cell is in communication with a submatch line selected from the group consisting of said single submatch line, said one or more submatch lines, and any combination of said single submatch line and said one or more submatch lines.

41. The CAM of claim 38 further comprising a single sense amplifier coupled to receive input from said one or more submatch lines and said single submatch line.

42. The CAM of claim 38 further comprising a plurality of sense amplifiers coupled to receive input from a source selected from the group consisting of said one or more submatch lines, said single submatch line, and any combination of said one or more submatch lines and said single submatch line.

43. The CAM of claim 38 wherein said submatch lines are substantially of a same length.

44. The CAM of claim 38 wherein said submatch lines are of different lengths.

45. The CAM of claim 38 wherein said submatch lines use substantially the same IC interconnect layers.

46. The CAM of claim 38 wherein said submatch lines use different IC interconnect layers.

47. The CAM of claim 38 wherein said submatch lines are substantially of a same capacitance.

48. The CAM of claim 38 wherein a particular cell is in communication with said one or more submatch lines and said single submatch line.

49. A method comprising:
coupling less than all memory cells in a row of a sub-array of a CAM to a same sense amplifier;
coupling any remaining said less than all memory cells to a second sense amplifier and;
routing one or more lines between a data line and a match line via.

50. A method comprising:
coupling less than all memory cells in a row of a sub-array of a CAM to a first input of a multiple input sense amplifier;
coupling any remaining said less than all memory cells to one or more inputs other than said first input of said sense amplifier;
routing one or more lines between a low match line pickup via and a data line; and
routing one or more lines between said low match line and a complement of said data line.

51. The method of claim 50 wherein said multiple input sense amplifier is a two input sense amplifier.

52. The method of claim 51 wherein said one or more lines is selected from the group consisting of a voltage supply, a ground signal, a value bit, a data bit, a mask bit, a complement of said value bit, a complement of said data bit, and a complement of said mask bit.

53. A method for connecting cells in a row in a CAM sub-array, the method comprising:
separating a row match line into several submatch lines;
coupling less than all said cells in said row to a same sense amplifier; and
placing a trace between a match line pickup via and a data line.

54. A method for constructing an integrated circuit (IC) content addressable memory (CAM) comprising:
connecting less than all memory cells in a row of a sub-array of a CAM to a same sense amplifier;
connecting any remaining said less than all memory cells in said row of said sub-array of said CAM to a second sense amplifier; and
routing one or more signal lines between a match line pickup via and a compare data line and a complement of said compare data line associated with said memory cells in said row of said sub-array of said CAM.

55. An apparatus comprising:
a plurality of memory cells arranged in a row;
one or more match lines running substantially parallel to said row;
vias for connecting one or more said memory cells to said one or more match lines; and
one or more traces between said vias and data lines.

56. A method for connecting cells in a row in a CAM sub-array, the method comprising:
separating a row match line into several submatch lines;
coupling less than all said cells in said row to a same sense amplifier; and placing a trace between a data line pickup via and a match line.

57. An apparatus comprising:
a plurality of memory cells arranged in a row;
one or more data lines running substantially perpendicular to said row;
vias for connecting one or more said memory cells to said one or more data lines; and
one or more traces between said vias and match lines.

* * * * *